(12) United States Patent
Huang et al.

(10) Patent No.: US 6,753,588 B2
(45) Date of Patent: Jun. 22, 2004

(54) SEMICONDUCTOR RECTIFIER

(75) Inventors: Eddie Huang, Stockport (GB); Steven T. Peake, Warrington (GB)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/208,920

(22) Filed: Jul. 31, 2002

(65) Prior Publication Data

US 2003/0038335 A1 Feb. 27, 2003

(30) Foreign Application Priority Data

Aug. 24, 2001 (GB) .............................................. 0120595

(51) Int. Cl.$^7$ .............................................. H01L 29/00
(52) U.S. Cl. ...................... 257/508; 257/155; 257/471; 257/476; 257/109; 257/622; 257/475
(58) Field of Search ................................. 257/508, 330, 257/155, 260, 485, 156, 475–476, 471, 109, 622

(56) References Cited

U.S. PATENT DOCUMENTS

| 4,903,189 A | * | 2/1990 | Ngo et al. | 257/331 |
|---|---|---|---|---|
| 4,982,260 A | * | 1/1991 | Chang et al. | 257/656 |
| 5,017,976 A | * | 5/1991 | Sugita | 257/494 |
| 5,172,208 A | * | 12/1992 | Malhi | 257/476 |
| 5,241,195 A | * | 8/1993 | Tu et al. | 257/155 |
| 5,365,102 A | * | 11/1994 | Mehrotra et al. | 257/475 |
| 5,612,567 A | * | 3/1997 | Baliga | 257/475 |
| 6,265,735 B1 | * | 7/2001 | Takahashi et al. | 257/136 |
| 6,501,146 B1 | * | 12/2002 | Harada | 257/475 |

FOREIGN PATENT DOCUMENTS

| DE | 19801999 A | 12/1998 | ......... H01L/29/872 |
|---|---|---|---|

OTHER PUBLICATIONS

PHGB010013US, Ser. No. 10/062,601; Filed Jan. 31, 2002.

* cited by examiner

Primary Examiner—David Nelms
Assistant Examiner—Andy Huynh
(74) Attorney, Agent, or Firm—Aaron Waxler

(57) ABSTRACT

A semiconductor rectifier includes an intermediate semiconductor region (29) extending between anode (9) and cathode (7) contacts. A trenched gate (19) with insulated sidewalls (15) and base (17) can deplete the intermediate region. However, a shield region (23) acts to shield the intermediate region (29) from the gate (19) to allow current to flow in dependence on the polarity of the voltage applied between anode and cathode contacts (9, 7).

8 Claims, 5 Drawing Sheets

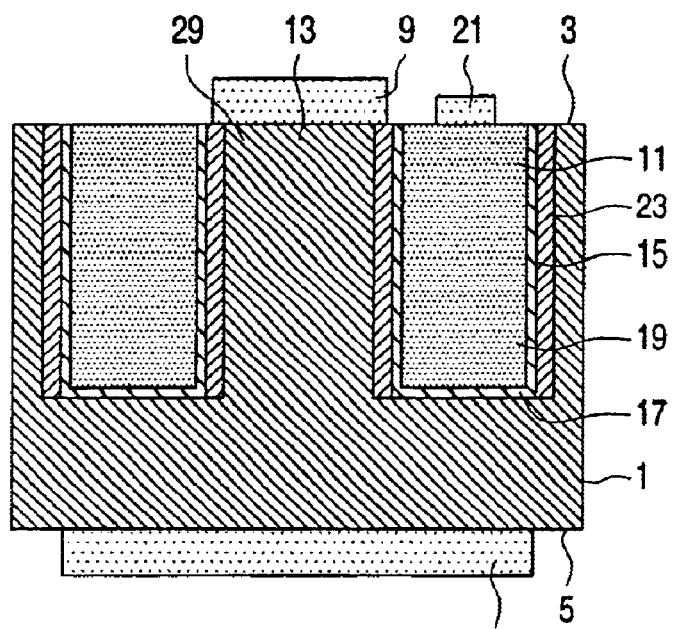
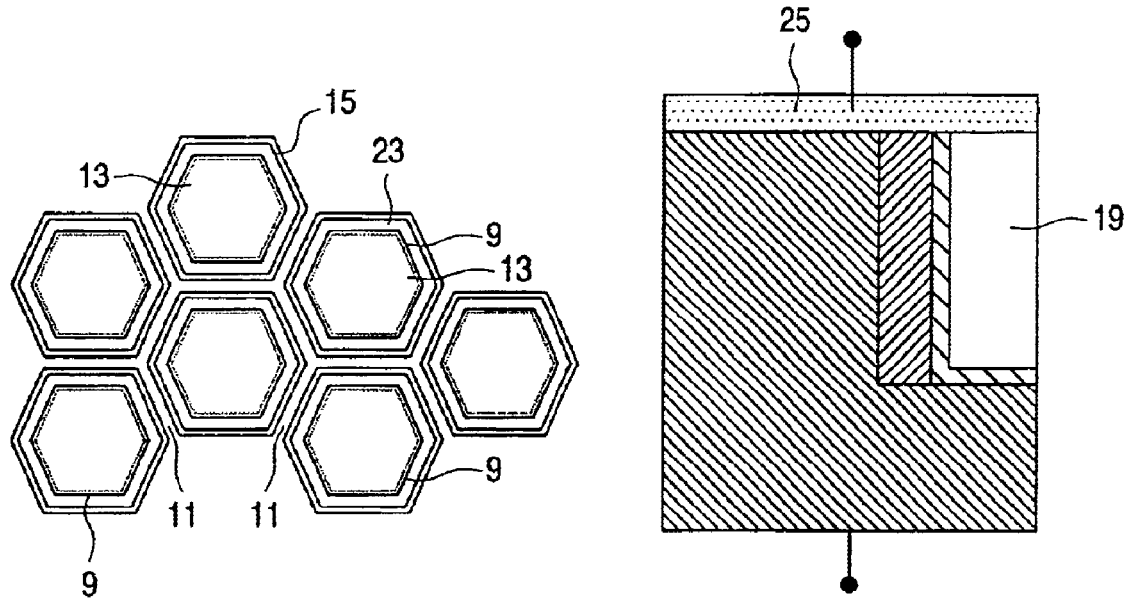
Fig.1
Fig.2  Fig.3

SEMICONDUCTOR RECTIFIER

FIELD OF THE INVENTION

The invention relates to a semiconductor rectifier, and in particular to a semiconductor rectifier using a trench structure.

BACKGROUND OF THE INVENTION

A wide variety of different semiconductor rectifiers are known. The most widely adopted are conventional bipolar diodes and Schottky diodes.

A particularly desirable rectifier parameter is a good blocking characteristic in the off-state, including a high breakdown voltage. It would accordingly be desirable to provide a rectifier with such enhanced blocking capability.

One method of providing a rectifier is to use a conventional MOSFET as a rectifier. In this case, in the on state the channel is essentially resistive giving some conduction even at very low forward voltages. The disadvantage is that the gate of the MOSFET needs to be controlled synchronously with the voltage across the source and drain of the MOSFET in order to provide rectifying action. This requires additional control circuitry and is generally undesirable.

There thus remains a requirement for an improved rectifier.

SUMMARY OF THE INVENTION

According to the invention, there is provided a semiconductor rectifier, comprising: an anode contact and a cathode contact; an intermediate semiconductor region of first conductivity type extending between the anode and the cathode contacts; at least one trenched gate electrode flanking the intermediate semiconductor region; a shield semiconductor region of second conductivity type opposite to the first conductivity type between the at least one trenched electrode and the intermediate semiconductor region, the shield semiconductor region being connected to one of the anode and the cathode contacts; a gate insulating layer between the shield semiconductor region and the trenched electrode; and a separate gate contact for applying a voltage to the gate to deplete the intermediate semiconductor region; wherein the intermediate semiconductor region can be depleted by applying a voltage to the gate and a voltage of a first polarity between anode and cathode and when a voltage of opposite polarity to the first polarity is applied between anode and cathode the shield semiconductor region conducts to shield the intermediate semiconductor region from the voltage applied to the gate to allow a conductive path through the intermediate semiconductor region between the anode and the cathode.

The invention works by applying a constant voltage to the gate sufficient to deplete the intermediate region. However, the shield region is filled with carriers when a voltage of one polarity is applied between the anode and cathode. For example, with an n-type intermediate region and a p-type shield region connected to the anode, the p-type shield regions will be filled with holes when the anode is positive with respect to the cathode. In this state, the shield regions will shield the intermediate regions from the bulk of the effect of the applied gate voltage, so that the anode and cathode are connected through the intermediate semiconductor region. The on-resistance of this structure can be quite low.

Keeping to the same example, when the anode is negative with respect to the cathode, the shield regions will be depleted and no longer shield out the effect of voltage applied to the gate electrode. The gate electrodes are then free to deplete the intermediate region and thus prevent a current flow between anode and cathode.

Preferably, the anode contact to the intermediate semiconductor region is a Schottky contact. Using such a structure, the Schottky contact causes rectification at low anode-cathode voltages. At higher forward voltages, the device conducts. At higher reverse voltages, the shield semiconductor region is depleted, as is the intermediate semiconductor region, and some of the voltage is dropped across the intermediate region. In this way, higher breakdown voltages can be obtained than simply using the Schottky contact itself for any given doping of the intermediate region. Preferably, the Schottky contact is a low barrier Schottky to minimise voltage drops in the structure. Preliminary modelling results suggest that the device according to the invention may deliver a greater improvement in breakdown voltage than using a trenched Schottky device where the gate is connected to the anode rather than to a more negative constant voltage source as in the present invention.

Conveniently, the intermediate semiconductor region may be a semiconductor body having opposed first and second faces, with the anode contact on one face and the cathode on the opposite face. The trenched gate electrode may then be provided in an insulating trench extending through the body towards the second face from the first face. The wall and base of the trench may be insulated by the gate insulating layer.

The shield semiconductor region may then extend along the outside of the side walls of the trench.

In an alternative structure, the shield semiconductor region may extend not merely along the side walls of the trench, but also underneath the base of the trench. In this way, the effect of any regions of high ionisation integral and hence high risk of breakdown that might otherwise be present at the corner between the intermediate semiconductor region, the shield semiconductor region and the gate insulating layer can be reduced. The alternative arrangement accordingly can provide a higher breakdown voltage.

The most similar device of which the applicants are aware is a static induction thyristor (SIT). This relies on depletion layers spreading from buried p-type regions to join up and prevent current flow between anode and cathode. Accordingly in an SIT the p-regions will deplete the path between anode and cathode regardless of the voltage between anode and cathode. The arrangement of the invention works in a similar but different way. Again, a depletion region extends to pinch off conduction but it will do this depending on the voltage applied to the p-region. The polarity of the voltage applied between anode and cathode causes the shield regions to conduct or not to conduct, and hence allows or prevents conduction between anode and cathode.

The structure according to the present invention responds spontaneously to changes in the anode bias to go into a conducting or a blocking state depending on the polarity. Thus, the conducting and blocking states come about automatically when the anode and cathode are biased, without the need to drive the gate "synchronously" with changes in anode biased plurality, as would be required using a MOSFET.

The only additional circuitry required is a simple negative voltage source to permanently bias the gate. This is available in many application circuits and does not present a significant drawback.

It will be appreciated the invention could be applied to either p-type or n-type circuits, in a variety of different materials, dopings or structures.

Other advantageous technical features of the present invention are set out in the attached dependent claims.

BRIEF DESCRIPTION OF THE DRAWINGS

Specific embodiments of the invention will now be described, purely by way of example, with reference to the accompanying drawings in which FIG. 1 shows a first embodiment of a semiconductor rectifier according to the invention;

FIG. 2 shows part of the structure of FIG. 1 used for modelling;

FIG. 3 shows a comparative example similar to the structure of FIG. 2;

It should be noted that all of the Figures are diagrammatic and not to scale, and that the relative dimensions of the parts have been exaggerated and reduced in size for clarity and convenience. Like reference numbers are generally used to refer to corresponding or similar features.

DETAILED DESCRIPTION OF THE INVENTION

Figure 4:
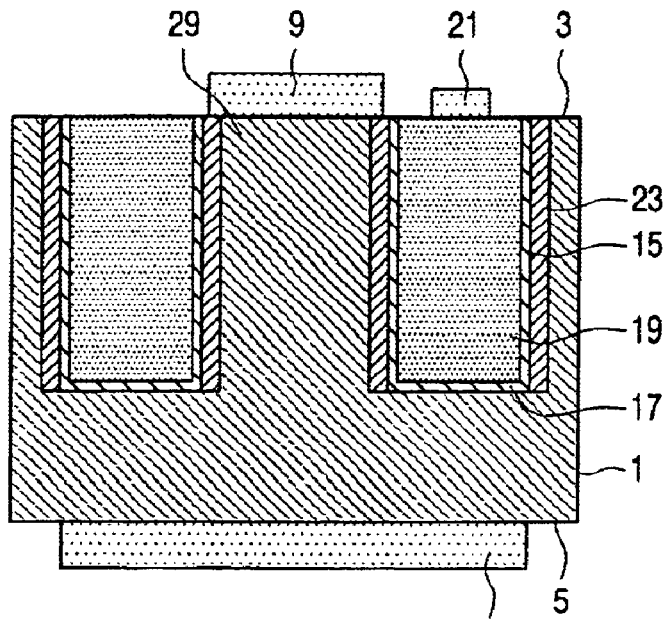
FIG. 4 shows a second embodiment of a semiconductor rectifier according to the invention.

Referring to FIG. 1, a semiconductor body 1 of a first conductivity type has a first face 3 and an opposed second face 5. A low barrier Schottky contact 9 is provided on the first face 3 and an ohmic contact 7 on the second face 5. In the described embodiment the first face 3 may be considered to be the top face and the first contact 9 on the first face 3 is an anode contact. The second face 5 is in the example the bottom face and carries the cathode contact 7.

A plurality of trenches 11 define at least one semiconductor mesa 13 between the trenches. The mesa shape may be, for example, hexagonal, square, or curved. A plurality of mesas may be defined as illustrated in FIG. 2, which shows a hexagonal array of mesas 13 and corresponding hexagonal network of trenches 11. In this example, the trenches are all linked together. The trenches may be, for example, between 1 µm and 10 µm deep. Modelling suggests that this range of depths is sufficient for the device to work without requiring trenches of excessive depth.

The trenches have insulated side walls 15, an insulated base 17 which together form a gate insulator 15,17, and contain conductive material forming a gate 19. The material of the side walls 15 and base 17 may be, for example, oxide, nitride, or other convenient insulating material. The gate may be formed of any suitable conductor or semiconductor, for example, doped polysilicon or amorphous silicon.

A gate contact 21 is provided to connect to the conductive gate 19.

The central region 29 of the mesas 13 is doped n-type, and indeed in the example is integrally formed with the material of the semiconductor body 1. As the skilled person will appreciate, it is of course also possible that the mesas are formed in an epitaxial layer. The point is that there is a conductive path from the first electrode 9 to the second electrode 7 through a semiconductor intermediate region 29, here the central region of the mesa 13 which may be depleted by applying a voltage to the gate. In the example, the intermediate region 29 which is controlled by the gate 11 is connected to the cathode contact 7 through body 1.

A shield region 23 of semiconductor material is provided in the mesa 13 between the trench side walls 15 and the central region 29 of the mesa 13. The shield region 23 is doped to be of opposite conductivity type to the intermediate semiconductor region 1,29 but more lightly doped. Thus, the intermediate semiconductor region 1,29 may be doped n-type and the shield region 23 p$^-$-type. Alternatively, the intermediate semiconductor region 29 and body 1 may be p-type and the shield region 23 n$^-$-type. In this latter case, the top electrode 9 is more properly referred to as the cathode and the lower electrode 7 the anode.

The shield region 23 is connected to the anode 9, which extends over both shield region 23 and intermediate region 29 to contact both regions.

In use, a negative gate voltage is applied to the gate electrode 11 on gate contact 21. Voltages in the present description are voltages referred to the voltage applied to the lower electrode 7 (cathode).

When a positive voltage is applied to the anode 9, the p-type shield regions 23 are filled with holes and accordingly conduct when the anode 9 is positive with respect to the cathode 7. In this state, the shield regions 23 can shield the intermediate regions 29 from the bulk of the effect of the applied gate voltage, so that the anode 9 and cathode 7 are connected through the intermediate semiconductor region 29, which is doped sufficiently to conduct.

Conversely, when a negative voltage is applied to the anode, the shield region 23 becomes depleted of holes and is no longer able to shield the intermediate region 29 from the effects of the voltage applied to the gate electrode 11. The voltage applied to the gate electrode 11 accordingly depletes the intermediate region 29 and blocks conduction between anode 7 and cathode 9.

A specific structure according to the invention was modelled, purely by way of example. The shield region 23 in the modelled structure was doped p$^-$-type with a doping concentration of $1.5 \times 10^{17}$ cm$^{-3}$. The doping concentration in the intermediate semiconductor region was set to be $4 \times 10^{16}$ cm$^{-3}$. The gate oxide thickness was 0.04 µm, and the width of the shield region 23 0.3 µm. These values apply to all the modelled results below except where stated otherwise.

The results for this example according to the invention were compared with a structure according to a comparative example illustrated in FIG. 3 in which the anode contact 9 and the gate contact 21 are replaced by a single Schottky contact 25. The remaining layers and doping concentrations were the same as in the modelled structure.

Initial modelling was carried out for trench depths between 1 and 2.5 µm, but the properties of the devices did not vary much in this range. The single Schottky contact device (FIG. 3) gave a breakdown voltage of around 25 volts. With the example according to the invention, a gate voltage of −18 volts applied to the gate electrode 11 gave an anode-cathode breakdown voltage of 30 volts. Similar results were obtained with −20 volts applied to the gate 11. Accordingly, the device according to the invention gave a better breakdown voltage than was obtained with the Schottky structure.

An alternative structure according to a second embodiment, illustrated in FIG. 4, differs from the arrangement of FIG. 1 in that the shield region 23 is provided not only adjacent to the side walls 15 of the trench but also under the base 17. The depth of the shield region below the trench was fixed at 0.4 µm. This minimises any possibility of breakdown at the corner between the intermediate semiconductor region 1, the shield region 23 and the sidewalls 15 and base 17 of the trench.

Figure 5:
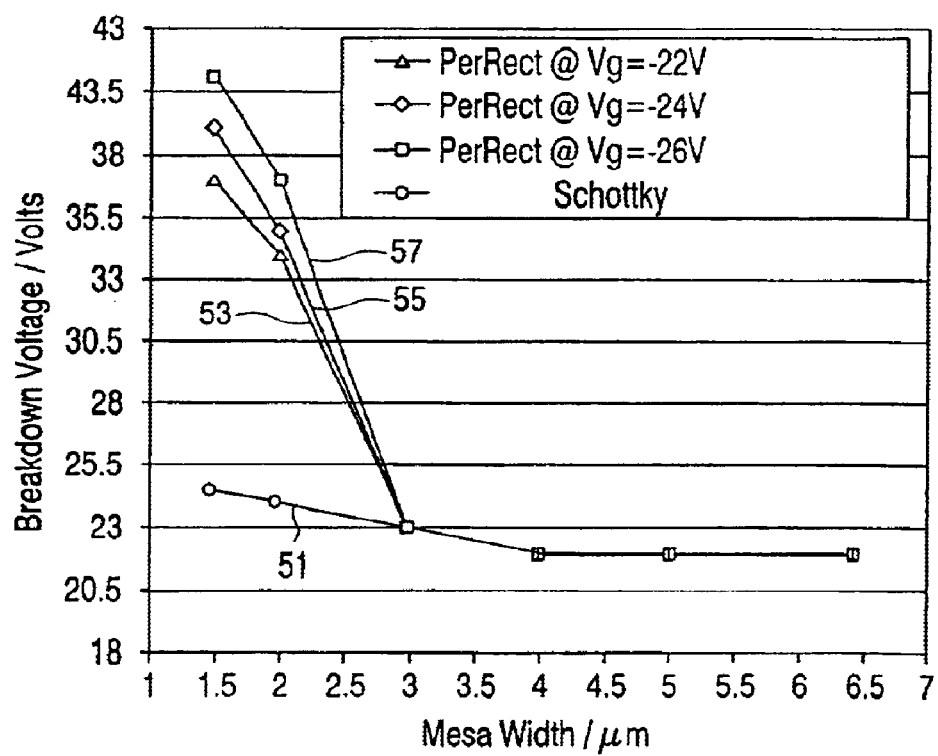
FIG. 5 shows the breakdown voltage as a function of mesa width for a number of gate voltages.

Results were then modelled taken for the comparative example of FIG. 3 and the device according to the invention of FIG. 4, and these results are presented in FIG. 5. The modelling was carried out for three different gate voltages applied to the gate 11, −22 V (curve 53), −24 V (curve 55) and −26 V (curve 57), together with the comparative example of FIG. 3 (curve 51). The modelling was carried out with the same doping levels as previously, for a number of different mesa 13 widths.

As will be apparent, the invention delivers significantly greater breakdown voltages for small mesa widths than the Schottky trench structure according to FIG. 3. It is of course to be expected that the benefits of the invention are observed for small mesa widths, since the width of the mesa 13 should be sufficiently small so that the semiconductor in the mesa 13 can be depleted by the voltage applied to the gate electrode. It will be noted that the performance of the rectifier according to the invention is accordingly much better at low mesa widths, particularly below 3 µm. Furthermore, the greater the magnitude of the negative voltage applied to the gate electrode 11, the better the breakdown voltage of the resulting structure.

Figure 6:
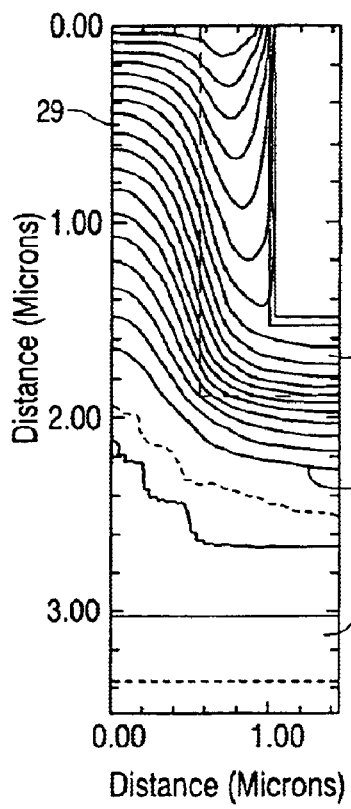
FIG. 6 shows the voltage contours in the second embodiment of the invention.

FIG. 6 illustrates the voltage contours 61 when the device according to FIG. 4 is blocking 40 volts with a negative gate voltage of −24 volts applied to the gate electrode 11. The horizontal axis shows the distance from the centre of the mesa 13; accordingly this device has a mesa width of 2 µm. The figure clearly shows the absence of voltage contours 61 in the trench region 11.

Figure 7:
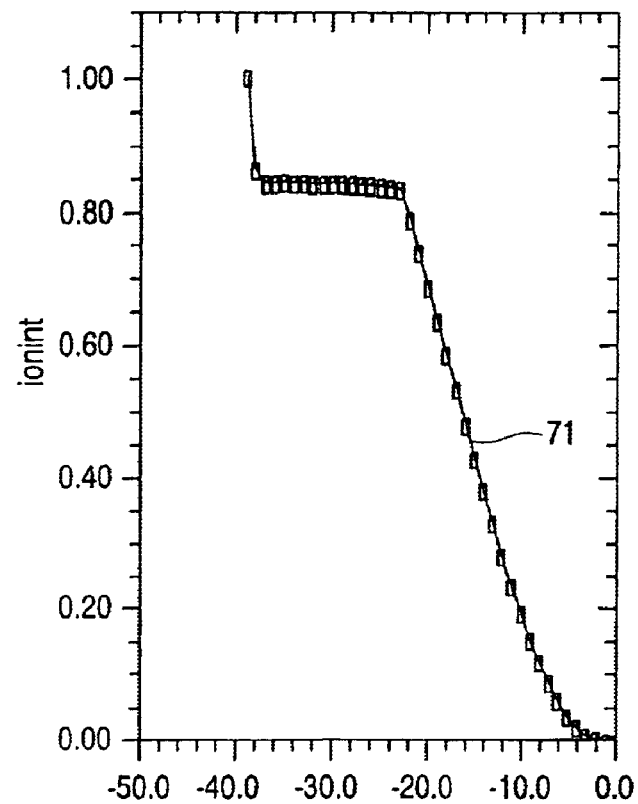
FIG. 7 is a graph showing the ionisation integral as a function of the anode-cathode voltage.

FIG. 7 is a plot 71 of the ionisation integral as a function of anode voltage with a negative gate voltage of −24 volts. Breakdown occurs when the ionisation integral exceeds 1. As can be seen, the breakdown occurs at around −40 volts.

Figure 8:
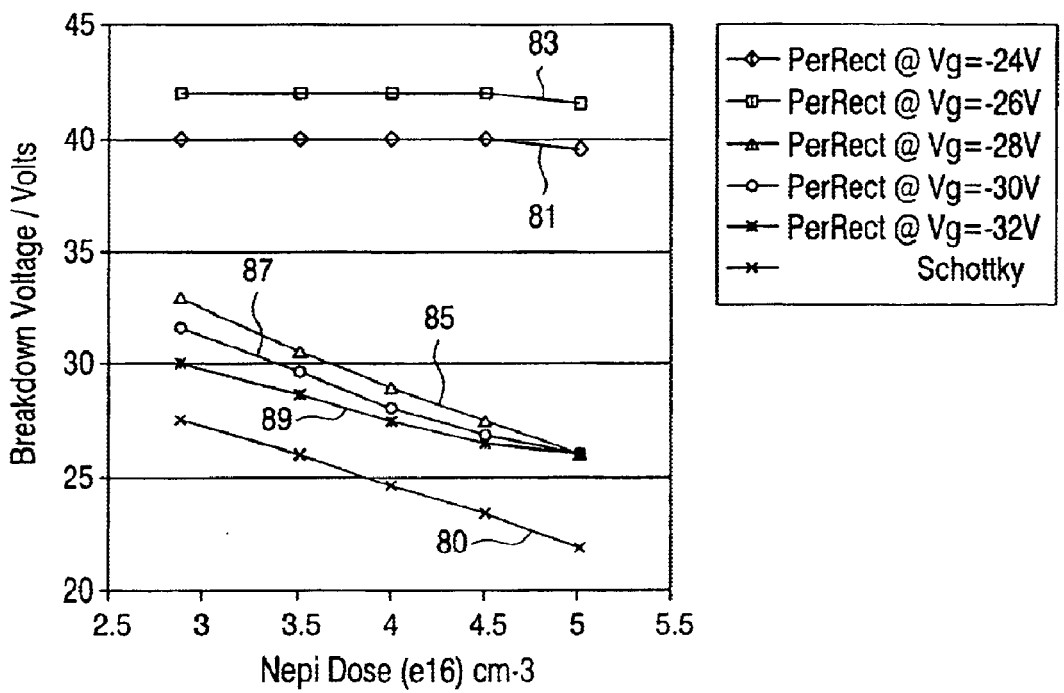
FIG. 8 is a graph showing the breakdown voltage as a function of doping concentration in the intermediate layer.

The effect of varying the doping concentration in the n-type intermediate region 1 was then determined. A plot of the breakdown voltage against concentration in the n-type intermediate region varying between $3 \times 10^{16} \text{cm}^{-3}$ and $5 \times 10^{16} \text{cm}^{-3}$ for a number of different gate voltages is provided in FIG. 8. Curve 81 is for a gate voltage of −24 V, curve 83 for −26 V, curve 85 for −28 V, curve 87 for −30 V and curve 89 for −32 V. Again, a comparison curve 80 for a Schottky trench device (FIG. 3) is also shown. As can be seen, the device according to the invention produces some improvement over a standard Schottky device even with voltages from −28 volts to −32 volts applied to the gate electrode 11, but the best results are obtained with voltages of −24 volts and −26 volts applied.

Figure 9:
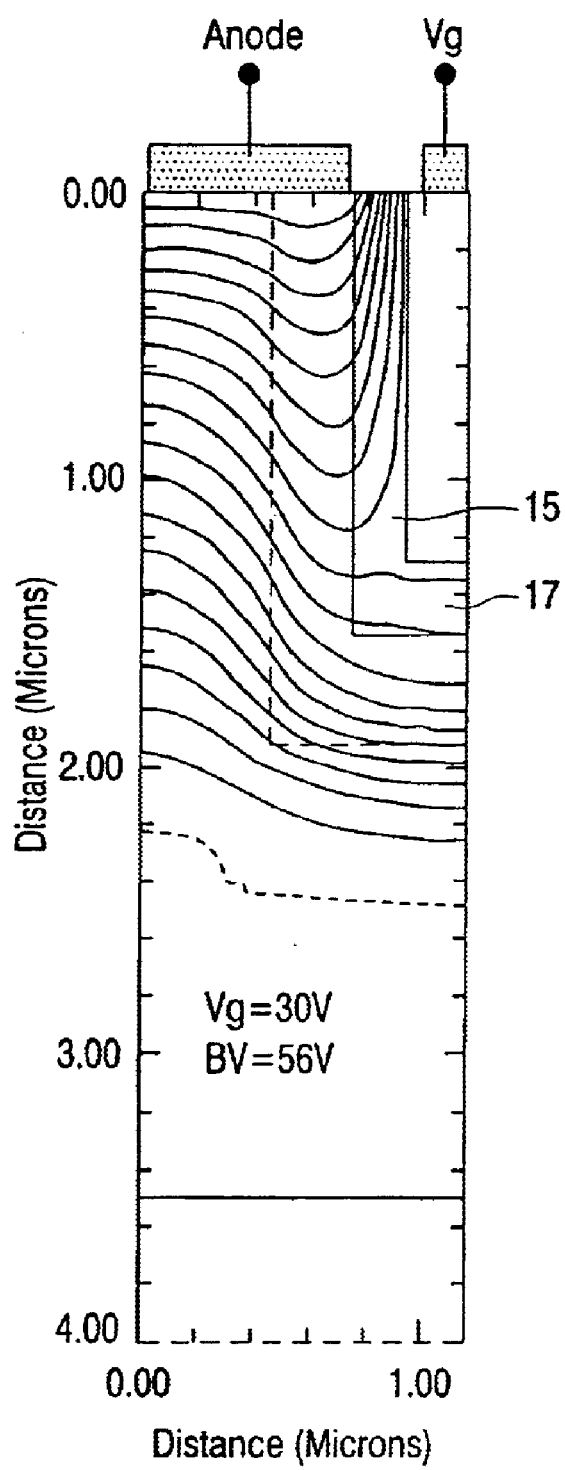
FIG. 9 is a graph showing the voltage contours in a device according to a third embodiment of the invention having a 2 µm thick gate oxide layer.

Results were then obtained using a much thicker gate oxide, 0.2 µm thick rather than 0.04 µm as previously. In this case, with a gate voltage of −30 volts applied, the breakdown voltage was 56 volts between anode and cathode. FIG. 9 illustrates the voltage contours.

Figure 10:
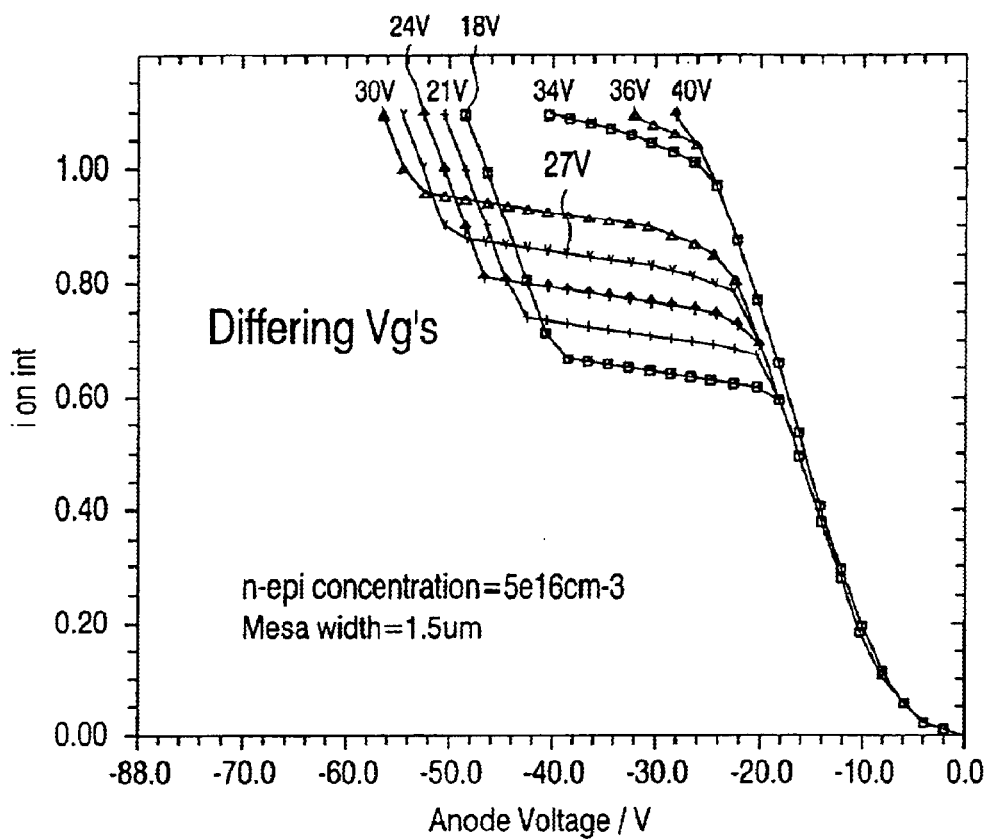
FIG. 10 is a graph of ionisation integral against anode voltage for a number of different gate voltages.

It should not be thought that the gate voltage on the gate can be increased without limit to improve the performance. FIG. 10 illustrates the ionisation integral as a function of anode voltage for different gate voltages for a mesa width of 1.5 µm and a doping concentration in the n-type intermediate region of $5 \times 10^{16} \text{cm}^{-3}$. As will be seen, a voltage of −30 volts applied to the gate delivers a plateau in the ionisation integral largely below the threshold value of 1.00. A good gate voltage to choose is a gate voltage that has a high magnitude (i.e. is more negative), since that increases the break down voltage, but in which the plateau in the ionisation integral occurs at a value less than 1.00 Higher magnitude gate voltages (more negative) have a plateau at an anode voltage where breakdown has already occurred, and so deliver worse breakdown voltages. Accordingly, in this case a gate voltage of −30 V gives a good breakdown performance.

The doping in the p-region may also be adjusted to affect the plateau. In general, when the doping concentration in the p-region is decreased, the plateau will shift downwards to allow a higher negative gate voltage to be applied.

Figure 11:
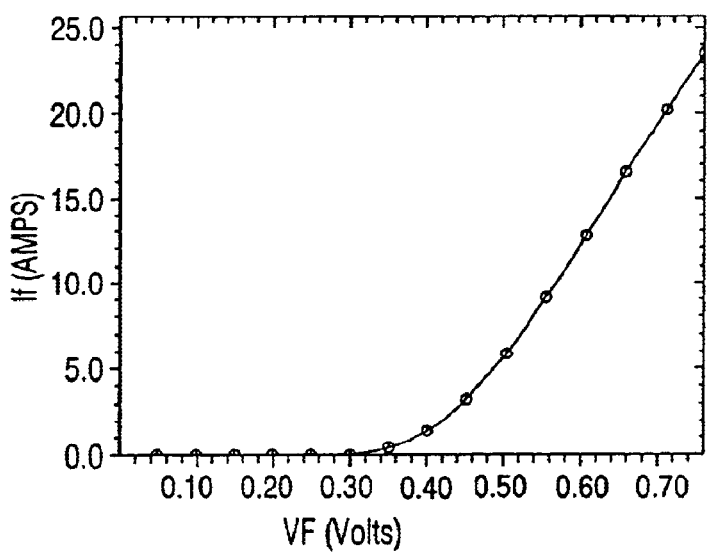
FIG. 11 is a graph of current against forward bias for a device according to fourth embodiment of the invention.

FIG. 11 shows the current in amps for a forward voltage supplied between anode and cathode for the case of a Schottky contact from the anode contact 9 to the top face 3 of the semiconductor body. This forward plot, unlike the reverse bias plot, is exactly the same as would be expected for a conventional Schottky diode.

Suitable methods of making the device will be readily apparent to the skilled reader from the description of the device itself. In particular, the trenches 11 may be formed by conventional anisotropic dry etching and the gate oxide 15,17 formed by thermal oxidation.

Although the specific embodiment shown has an n-type body with p-type shield layers, the skilled person will appreciate that these can readily be reversed. Moreover, the doping levels and mesa sizes may be adjusted to achieve the desired results.

From reading the present disclosure, other variations and modifications will be apparent to persons skilled in the art. Such variations and modifications may involve equivalent and other features which are already known in the design, manufacture and use of semiconductor devices and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

What is claimed is:

1. A semiconductor rectifier, comprising:
   an anode contact and a cathode contact;
   an intermediate semiconductor region of first conductivity type extending between the anode and the cathode contacts;
   at least one trenched gate electrode flanking the intermediate semiconductor region;
   a shield semiconductor region of second conductivity type opposite to the first conductivity type between the at least one trenched electrode and the intermediate semiconductor region, the shield semiconductor region being connected to one of the anode and the cathode contacts, the shield semiconductor region extending along the entire sidewalls of the trenched gate electrode;

a gate insulating layer between the shield semiconductor region and the trenched electrode; and a separate gate contact for applying a voltage to the gate electrode to deplete the intermediate semiconductor region;

wherein the intermediate semiconductor region can be depleted by applying a constant voltage to the gate electrode and a voltage of a first polarity between anode and cathode and when a voltage of opposite polarity to the first polarity is applied between anode and cathode the shield semiconductor region conducts to shield the intermediate semiconductor region from the constant voltage applied to the gate electrode to allow a conductive path through the intermediate semiconductor region between the anode and the cathode.

2. A semiconductor rectifier according to claim 1 wherein the shield semiconductor region extends around the whole base of the trenched gate electrode.

3. A semiconductor rectifier according to claim 1 wherein:

the intermediate semiconductor region is a semiconductor body having opposed first and second faces, the anode contact being on one face and the cathode contact on the opposite face; and the or each trenched gate electrode is in an insulated trench extending through the body towards the second face from the first face, the gate insulating layer forming insulated sidewalls and an insulated base of the trench.

4. The semiconductor device according to claim 3 wherein the intermediate layer forms at least one mesa at the first face laterally surrounded by the shield semiconductor region, and the shield semiconductor region is surrounded by the at least one trench electrode.

5. The semiconductor device according to claim 4 wherein the at least one mesa is of lateral dimension in the range from 1 $\mu$m to 5 $\mu$m.

6. The semiconductor device according to claim 4 wherein there are a plurality of mesas connected in parallel.

7. The semiconductor device according to the claim 2 wherein the intermediate semiconductor region is doped n-type, the shield semiconductor region is doped p$^-$, the cathode contact is provided on the second face of the semiconductor body and the anode contact is provided on the first face of the semiconductor body in contact with the intermediate and shield semiconductor regions.

8. The semiconductor device according to claim 1 wherein the anode contact is a Schottky contact.

* * * * *